(12) United States Patent
Huang et al.

(10) Patent No.: US 12,315,731 B2
(45) Date of Patent: May 27, 2025

(54) INTEGRATED CIRCUIT WITH NANOSHEET TRANSISTORS WITH METAL GATE PASSIVATION

(71) Applicant: Taiwan Semiconductor Manufacturing Co., Ltd., Hsinchu (TW)

(72) Inventors: Mao-Lin Huang, Hsinchu (TW); Lung-Kun Chu, Hsinchu (TW); Chung-Wei Hsu, Hsinchu (TW); Jia-Ni Yu, Hsinchu (TW); Kuo-Cheng Chiang, Hsinchu (TW); Kuan-Lun Cheng, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 237 days.

(21) Appl. No.: 17/381,006

(22) Filed: Jul. 20, 2021

(65) Prior Publication Data
US 2023/0029370 A1    Jan. 26, 2023

(51) Int. Cl.
| | |
|---|---|
| *H01L 21/28* | (2025.01) |
| *H01L 21/02* | (2006.01) |
| *H10D 30/01* | (2025.01) |
| *H10D 30/67* | (2025.01) |
| *H10D 62/10* | (2025.01) |
| *H10D 84/01* | (2025.01) |
| *H10D 84/03* | (2025.01) |
| *H10D 84/85* | (2025.01) |

(52) U.S. Cl.
CPC .... *H01L 21/28247* (2013.01); *H01L 21/0259* (2013.01); *H10D 30/031* (2025.01); *H10D 30/6735* (2025.01); *H10D 30/6757* (2025.01); *H10D 62/118* (2025.01); *H10D 84/0167* (2025.01); *H10D 84/0172* (2025.01); *H10D 84/038* (2025.01); *H10D 84/85* (2025.01)

(58) Field of Classification Search
CPC .......... H01L 21/28247; H01L 21/0259; H01L 21/823807; H01L 21/823828; H01L 27/092; H01L 29/0665; H01L 29/42392; H01L 29/66742; H01L 29/78696
See application file for complete search history.

(56) References Cited

U.S. PATENT DOCUMENTS

| | | | |
|---|---|---|---|
| 10,844,484 B2* | 11/2020 | Jdira | C23C 16/4481 |
| 2019/0237336 A1* | 8/2019 | Wang | H01L 29/42376 |
| 2019/0371903 A1* | 12/2019 | Bao | H01L 21/28185 |
| 2020/0035567 A1* | 1/2020 | Chanemougame | H10D 84/0177 |
| 2020/0051981 A1* | 2/2020 | Yang | H01L 27/092 |
| 2020/0091288 A1* | 3/2020 | Lee | H01L 29/6656 |
| 2020/0135915 A1* | 4/2020 | Savant | H01L 21/0228 |
| 2021/0134950 A1* | 5/2021 | Hsu | H01L 21/31111 |

* cited by examiner

*Primary Examiner* — Lex H Malsawma
*Assistant Examiner* — Sean Ayers Winters
(74) *Attorney, Agent, or Firm* — Seed IP Law Group

(57) ABSTRACT

A method for processing an integrated circuit includes forming N-type and P-type gate all around transistors and core gate all around transistors. The method deposits a first metal gate layer for the P-type transistors and a second metal gate layer for the N-type transistors. The method forms a passivation layer in-situ with the metal gate layer of the P-type transistors.

20 Claims, 9 Drawing Sheets

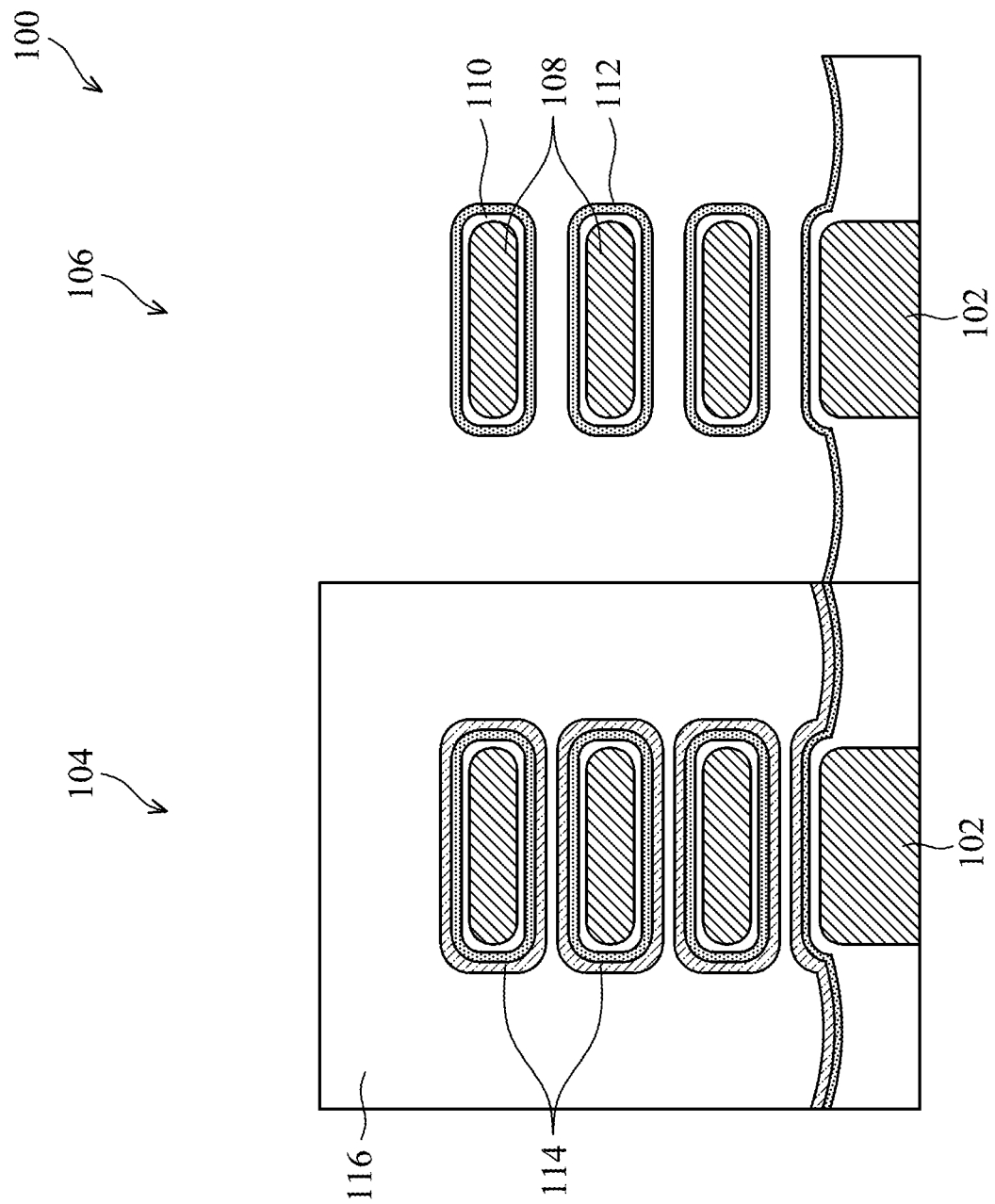

INTEGRATED CIRCUIT WITH NANOSHEET TRANSISTORS WITH METAL GATE PASSIVATION

BACKGROUND

Technical Field

The present disclosure relates to the field of semiconductor fabrication. The present disclosure relates more particularly to forming gate all around transistors in integrated circuits.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Integrated circuits may include N-type transistors and P-type transistors. The gate electrodes of N-type and P-type transistors may utilize different materials and processes. With gate all around transistors, problems can arise in forming the gate metals of the N-type and P-type transistors.

BRIEF DESCRIPTION OF THE SEVERAL VIEWS OF THE DRAWINGS

FIGS. 1A-1F are cross-sectional views of an integrated circuit at various stages of processing, according to one embodiment.

DETAILED DESCRIPTION

Figure 1A:
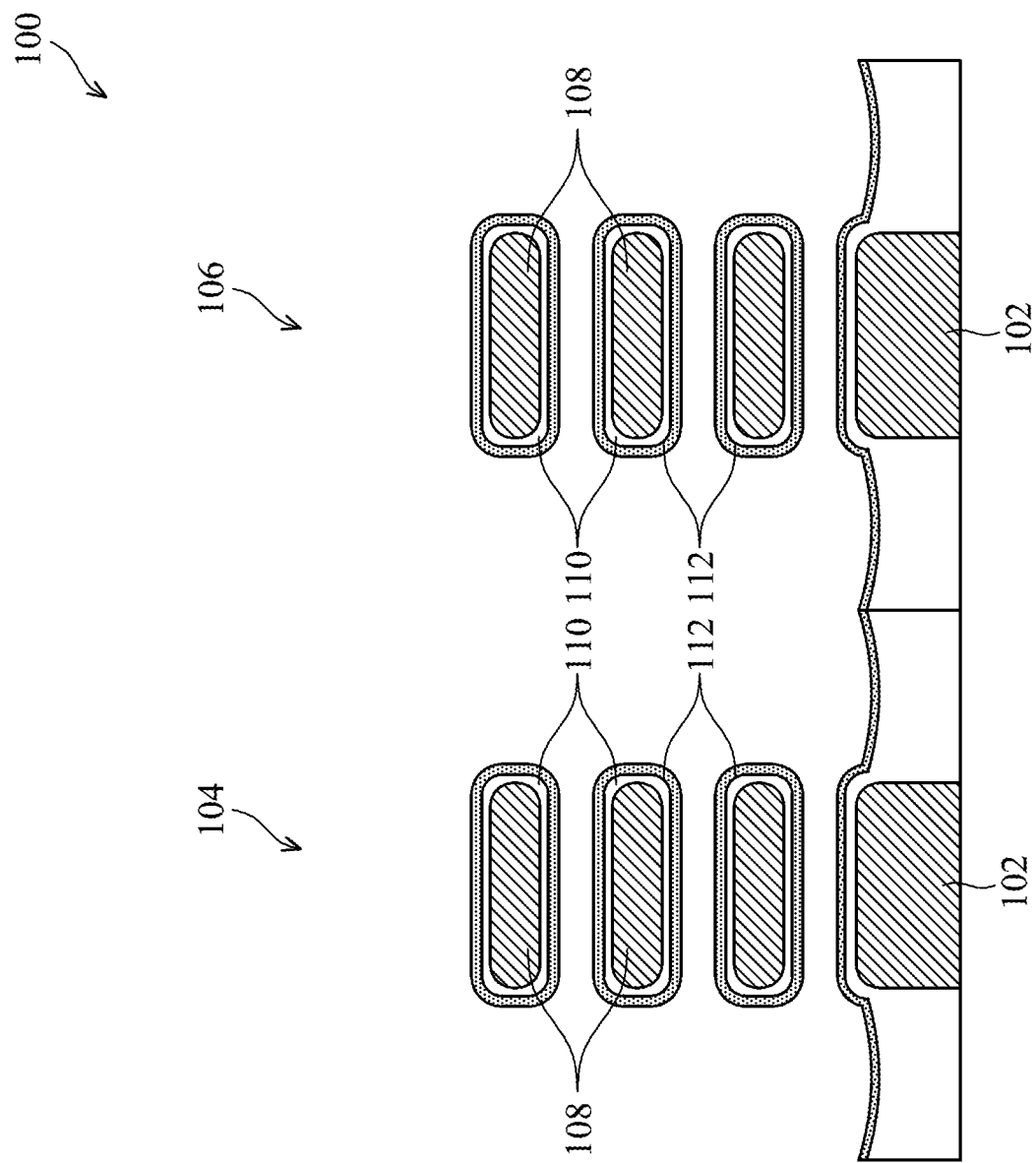

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure of the present disclosure provide an integrated circuit including P-type and N-type transistors. The P-type transistors including a passivation layer on a thin metal gate layer. The passivation layer is formed in-situ with the thin metal gate layer, thereby preventing oxidation of the thin metal gate layer. The result is that P-type transistors have high work functions, low threshold voltages, and low overall resistance in the gate. This leads to better functioning integrated circuits, higher wafer yields, and lower rates of scrapped wafers or dies FIGS. 1A-1F are cross-sectional views of an integrated circuit 100 at successive intermediate stages of processing, according to one embodiment. FIGS. 1A-1F illustrate an exemplary process for producing an integrated circuit that includes N-type and P-type nanosheet transistors. FIGS. 1A-1F illustrate how these types of transistors can be formed in a simple and effective process in accordance with principles of the present disclosure. Other process steps and combinations of process steps can be utilized without departing from the scope of the present disclosure.

FIG. 1A is a cross-sectional diagram of an integrated circuit 100 at an intermediate stage of processing, according to one embodiment. The view of FIG. 1A illustrates a transistor 104 and a transistor 106. The transistors 104 and 106 are formed in the same integrated circuit 100, though they may be located at different regions of the integrated circuit 100. In one example, the transistor 104 is an N-type transistor and the transistor 106 is a P-type transistor.

The integrated circuit 100 can include a large number of N-type transistors 104 and P-type transistors 106 coupled together in complex arrangements. The N-type transistors 104 and the P-type transistors 106 cooperate to process data, to write data to memory, to read data from memory, and to execute software instructions. The N-type and P-type transistors can be coupled together by metal interconnects formed in the integrated circuit 100.

The transistors 104 and 106 are gate all around transistors. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The integrated circuit 100 includes a semiconductor substrate 102. In one embodiment, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 102 includes silicon germanium (SiGe) buffer layers epitaxially grown on the silicon substrate 102. The germanium concentration of the SiGe buffer layers may increase from 30 atomic % germanium for the bottom-most buffer layer to 70 atomic % germanium for the top-most buffer layer. The substrate 102 may include various regions that have been suitably doped with impurities (e.g., p-type or n-type conductivity). The dopants are, for example boron ($BF_2$) for an n-type transistor and phosphorus for a p-type transistor.

The integrated circuit 100 may include one or more shallow trench isolations (not shown) separating the N-type transistors 104 from the P-type transistors 106, or separating the N-type transistors 104 from each other and the P-type transistors 106 from each other. The shallow trench isolation can be utilized to separate groups of transistor structures formed in conjunction with the semiconductor substrate 102. The shallow trench isolation can include a dielectric material. The dielectric material for the shallow trench isolation may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation without departing from the scope of the present disclosure.

The integrated circuit 100 includes a plurality of semiconductor nanosheets 108 or nanowires. The semiconductor nanosheets 108 are layers of semiconductor material. The semiconductor nanosheets 108 correspond to the channel regions of the transistors 104 and 106. The semiconductor nanosheets 108 are formed over the substrate 102. The semiconductor nanosheets 108 may include one or more layers of Si, Ge, SiGe, GaAs, InSb, GaP, GaSb, InAlAs, InGaAs, GaSbP, GaAsSb or InP. In one embodiment, the semiconductor nanosheets 108 are the same semiconductor material as the substrate 102. Other semiconductor materials can be utilized for the semiconductor nanosheets 108 without departing from the scope of the present disclosure.

In FIG. 1A, each transistor 104 and 106 have three semiconductor nanosheets 108. However, in practice, each transistor 104 and 106 may have many more semiconductor nanosheets 108 than three. For example, each transistor 104 may include between 3 and 20 semiconductor nanosheets 108. Other numbers of semiconductor nanosheets 108 can be utilized without departing from the scope of the present disclosure.

The width of the nanosheets 108 can be between 10 nm and 50 nm. The thickness of the nanosheets 108 can be between 4 nm and 10 nm. The distance between the nanosheets 108 can be between 8 nm and 15 nm. Other dimensions can be utilized for the semiconductor nanosheets 108 without departing from the scope of the present disclosure.

Each nanosheet 108 is covered by an interfacial dielectric layer 110. The interfacial dielectric layer 110 may be used in order to create a good interface between the semiconductor nanosheets 108 and subsequent dielectric layers, as will be described in further detail below. The interfacial dielectric layer 110 can assist in suppressing the mobility degradation of charge carries in the semiconductor nanosheets 108 that serve as channel regions of the transistors 104 and 106.

The interfacial dielectric layer 110 can include a dielectric material such as silicon oxide, silicon nitride, or other suitable dielectric materials. The interfacial dielectric layer 110 can include a comparatively low-K dielectric with respect to high-K dielectric such as hafnium oxide or other high-K dielectric materials that may be used in gate dielectrics of transistors. In the example of FIG. 1A, the interfacial dielectric layer 110 is silicon dioxide.

The interfacial dielectric layer 110 can be formed by a thermal oxidation process, a chemical vapor deposition (CVD) process, or an atomic layer deposition (ALD) process. The interfacial dielectric layer 110 can have a thickness between 0.1 nm and 2 nm. One consideration in selecting a thickness for the interfacial dielectric layer 110 is to leave sufficient space between the nanosheets 108 for gate metals, as will be explained in more detail below. Other materials, deposition processes, and thicknesses can be utilized for the interfacial dielectric layer 110 without departing from the scope of the present disclosure.

The interfacial dielectric layer 110 is covered by a high-K dielectric layer 112. The high-K dielectric layer 112 and the interfacial dielectric layer 110 collectively form a gate dielectric of the transistors 104 and 106. The high-K dielectric layer 112 and the interfacial dielectric layer 110 physically separate the semiconductor nanosheets 108 from the gate metals that will be deposited subsequent steps. The high-K dielectric layer 112 and the interfacial dielectric layer 110 isolate the gate metals from the semiconductor nanosheets 108 that correspond to the channel regions of the transistors.

The high-K dielectric layer 112 includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer 112 may include a first layer that includes HfO2 with dipole doping including La and Mg, and a second layer including a higher-K ZrO layer with crystallization.

The high-K dielectric layer 112 may be formed by CVD, ALD, or any suitable method. In one embodiment, the high-K dielectric layer 112 is formed using a highly conformal deposition process such as ALD in order to ensure the formation of a gate dielectric layer having a uniform thickness around each semiconductor nanosheet 108. In one embodiment, the thickness of the high-k dielectric is in a range from about 1 nm to about 3 nm. Other thicknesses, deposition processes, and materials can be utilized for the high-K dielectric layer 112 without departing from the scope of the present disclosure.

In one embodiment, at the stage of processing shown in FIG. 1A, the interfacial dielectric layer 110 has the same thickness on the nanosheets 108 of both the N-type transistor 104 and the P-type transistor 106. Accordingly, at the processing stage shown in FIG. 1A, the interfacial dielectric layer 110 can be deposited on the nanosheets 108 of the N-type transistor 104 and the P-type transistor 106 in a same deposition step. Likewise, the high-K dielectric layer 112 can be formed on the interfacial dielectric layer 110 of the transistors 104 and 106 in a same deposition step or process. The high-K dielectric layer 112 can have a same thickness in the transistors 104 and 106.

Figure 1B:
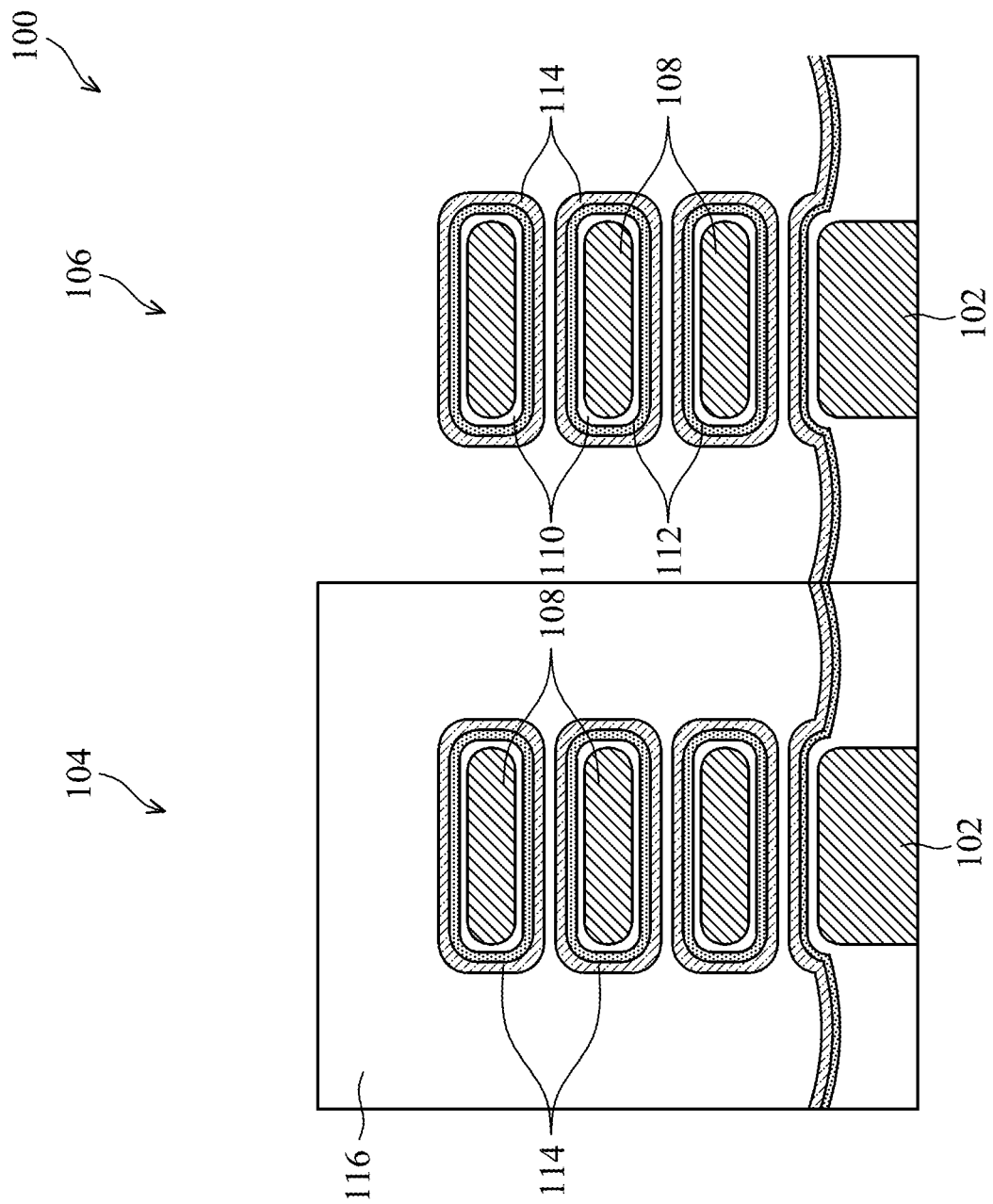

FIG. 1B is a cross-sectional view of the integrated circuit 100 at an intermediate stage of processing, according to one embodiment. In FIG. 1B, a first metal gate layer 114 has been deposited on the high-K dielectric layer 112 of both the N-type transistor 104 and the P-type transistor 106. The first metal gate layer 114 can include one or more of TiC, TiAlC, TaC, TaAlC, TaSiAlC, TiSiAlC or other suitable materials. The first metal gate layer 114 can have a thickness between 0.1 nm and 10 nm. The thickness of the first metal gate layer 114 is selected to leave a gap between adjacent nanosheets 108 of both the transistor 104 and the transistor 106. The first metal gate layer 114 can be deposited by a physical vapor deposition (PVD) process, an ALD process, a CVD process, or other suitable deposition processes. The first metal gate layer 114 can have other thicknesses, materials, and deposition processes without departing from the scope of the present disclosure.

The first metal gate layer 114 is a thin gate metal for the N-type transistor 104. The first metal gate layer is deposited all around the semiconductor nanosheets 108 on the high-K dielectric layer 112. The material of the first metal gate layer is selected to assist in providing a desired work function for the N-type transistor 104. In one embodiment, the first metal gate layer 114 does not impart the desired work function and threshold voltage characteristics for the P-type transistor 106.

Accordingly, In FIG. 1B a layer of photoresist 116 has been deposited and patterned. The layer of photoresist 116 is patterned to expose the first metal gate layer 114 on the high-K dielectric layer 112 of the semiconductor nanosheets 108 of the P-type transistor 106. The first metal gate layer 114 of the N-type transistor 104 is covered by the layer of photoresist 116. The layer of photoresist 116 can be deposited by standard photoresist deposition techniques including vapor deposition, spread deposition, spin on coating, or by other suitable process. The layer of photoresist 116 can be patterned by exposing the layer of photoresist 116 to light via a photolithography mask. Accordingly, the layer of photoresist 116 can be deposited and patterned using standard photolithography techniques.

FIG. 1C is a cross-sectional view of the integrated circuit 100 at an intermediate stage of processing, according to one embodiment. In FIG. 1C, an etching process has been performed on the integrated circuit 100. In particular, an etching process is performed on the portion of the integrated circuit 100 that is not covered by the photoresist 116. The etching process etches the first metal gate layer 114 from the transistor 106. The etching process can include an isotropic etching process that etches the first metal gate layer 114 and the hard mask layer 116 equally in all directions. The duration of the etching process is selected to entirely remove the first metal gate layer 114 from the nanosheets 108 of the transistor 106. The etching process can include a wet etch, a dry etch, an atomic layer etching (ALE) process, a timed etch, or other suitable etching processes. The first metal gate layer 114 is still present on the high-K dielectric layer 112 of the N-type transistor 104 because the N-type transistor 104 is covered by the photoresist 116 during the etching process.

Figure 1D:
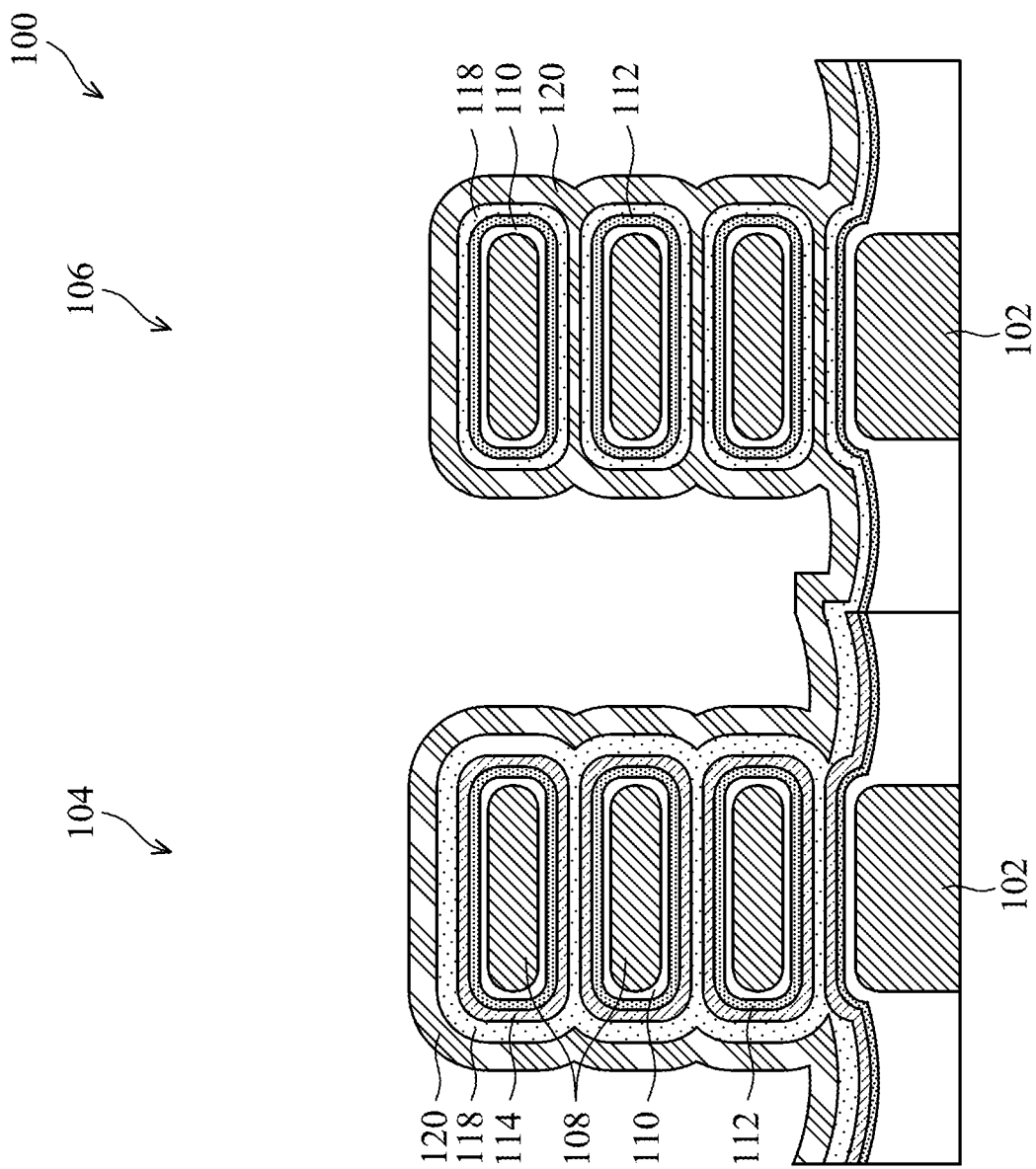

FIG. 1D is a cross-sectional view of the integrated circuit 100 at an intermediate stage of processing, according to one embodiment. In FIG. 1D, the photoresist layer 116 has been removed. The photoresist layer 116 can be removed by a plasma ash process. Other removal processes can be utilized to remove the photoresist layer 116 without departing from the scope of the present disclosure.

In FIG. 1D, a second metal gate layer 118 has been deposited after removal of the photoresist layer 116. The second metal gate layer 118 has been deposited on both the transistor 104 and the transistor 106. In particular, the second metal gate layer 118 has been deposited on the first metal gate layer 114 of the N-type transistor 104. The second metal gate layer 118 fills any remaining gaps between the semiconductor nanosheets 108 of the N-type transistor 104.

The second metal gate layer 118 is deposited directly on the high-K dielectric layer 112 of the P-type transistor 106. This is because the etching process that removed the first metal gate layer from the high-K dielectric layer 112 of the P-type transistor 106 exposed the high-K dielectric layer 112 of the P-type transistor 106. Accordingly, the second metal gate layer 118 is deposited directly on the high-K dielectric layer 112 of the P-type transistor 106.

The second metal gate layer 118 is a thin gate metal for the P-type transistor 106. Accordingly, the second metal gate layer 118 may be called a P-metal gate layer. The material and thickness of the P metal gate layer is selected to result in a desired work function for the P-type transistor 106. The second metal gate layer is the closest conductive layer to the semiconductor nanosheets 108 of the P-type transistor 106. Accordingly, the second metal gate layer 118 strongly affects the work function and overall threshold voltage of the P-type transistor 106. The material of the second metal gate layer 118 is selected to impart a higher work function to the P-type transistor 106. The high work function of the P-type transistor 106 results in a low threshold voltage of the P-type transistor 106. For the N-type transistor 104, a lower work function results in a lower threshold voltage. Accordingly, the first metal gate layer 114 is selected to have a relatively low work function so that the N-type transistor 104 has a low threshold voltage.

The second metal gate layer 118 can include one or more of TiN, TaN, WCN, MoN, or other suitable materials. The second metal gate layer 118 can have a thickness between 0.1 nm and 10 nm. The thickness of the second metal gate layer 118 is selected to leave a gap between adjacent nanosheets 108 of both the transistor 104 and the transistor 106. The second metal gate layer 118 can be deposited by a physical vapor deposition (PVD) process, an ALD process, a CVD process, or other suitable deposition processes. The second metal gate layer 118 can have other thicknesses, materials, and deposition processes without departing from the scope of the present disclosure.

One factor to take into consideration when forming the second metal gate layer 118 is potential oxidation of the second metal gate layer 118. If the second metal gate layer 118 oxidizes, then the work function of the P-type transistor 106 may be reduced. This is because atoms or compounds of oxygen, carbon, and fluorine may diffuse through the second metal gate layer 118 if the second metal gate layer 118 has oxidized. This reduces the work function and increases the threshold voltage of the P-type transistor 106.

One potential solution for preventing oxidation of the second metal gate layer 118 is to form a passivation layer on the second metal gate layer 118. The passivation layer can prevent the diffusion of oxygen, carbon, and fluorine through the second metal gate layer 118. However, formation of the passivation layer can itself cause oxidation of the second metal gate layer 118 if the passivation layer is deposited in a separate process from the deposition of the second gate metal 118.

Principles of the present disclosure overcome the drawbacks of other potential solutions by depositing a passivation layer 120 in-situ with the deposition of the second metal gate layer 118. The in-situ deposition of the passivation layer 120 with the second metal gate layer 118 ensures that no oxygen is introduced into the environment of the second metal gate layer 118 before deposition of the passivation layer 120. Accordingly, there will be no oxidation of the second metal gate layer 118 prior to deposition of the passivation layer 120. In one example, the passivation layer 120 entirely prohibits penetration of elements such as oxygen, carbon, and fluorine into second metal gate layer 118. The passivation layer 120 may prohibit all such unwanted particles or elements from penetrating past the surface of the passivation layer 120. In this case, the concentration of the unwanted particles within the passivation layer 120 is substantially zero.

In one embodiment, the passivation layer 120 is deposited without breaking vacuum conditions from the deposition of the second metal gate layer 118. This corresponds to in-situ deposition of the passivation layer 120. The deposition of the passivation layer 120 can be performed in a same deposition chamber as the deposition of the second metal gate layer 118 without breaking vacuum. Alternatively, the deposition of the passivation layer 120 can be performed in a separate deposition chamber from the deposition of the second metal gate layer 118 without breaking vacuum. In this case, the two deposition chambers are connected by a tube. The tube causes the deposition chambers to be in fluid communication such that the pressure in the chambers will be approximately equal. After deposition of the second metal gate layer 118 in the first deposition chamber, the wafer that includes integrated circuit 100 can be transferred through the tube to a second deposition chamber by a robot arm. The first and second deposition chambers are communicatively coupled such that the vacuum condition that that is present in the first deposition chamber is also present in the second deposition chamber. The passivation layer 120 can then be deposited in the second deposition chamber without breaking vacuum. This also corresponds to in-situ deposition of the passivation layer 120.

In one example, the second metal gate layer 118 is deposited with an ALD process. The passivation layer 120 can be deposited by an ALD process that begins immediately after the ALD process that deposited the second metal gate layer 118, without breaking vacuum conditions. Thus, the second metal gate layer 118 is not exposed to any oxygen prior to deposition of the passivation layer 120. This ensures that the second metal gate layer 118 will not oxidize. This process can result in a work function greater than or equal to 4.9 eV. A second benefit of this process is that the overall resistance of the metal gate of the P-type transistor 106 is very low because no oxidation of the second metal gate layer 118 has occurred.

The passivation layer 120 can include one or more of TaN, a combination of TaN and TiN, the combination of WCN and TiN, Al, AlOx, Si, SiOx, SiOn, SiN, or other suitable materials. The passivation layer 120 can have a thickness between 0.1 nm and 10 nm. In one example, if the passivation layer 120 is thinner than 0.1 nm, it may be insufficient to prevent dopants from diffusing into the second metal gate layer 118. In one example, if the passivation layer 120 is thicker than 10 nm, there may be insufficient space for subsequent filling processes. The passivation layer 120 can be deposited by an ALD or PVD. The passivation layer 120 can have other thicknesses, materials, and deposition processes without departing from the scope of the present disclosure.

The second metal gate layer 118 is positioned on the first metal gate layer 114 at the N-type transistor 104. The passivation layer 120 is positioned on the second metal gate layer 118 at the transistor 104. Accordingly, the transistor 104 includes both the first metal gate layer 114 and the second metal gate layer 118.

Figure 1E:
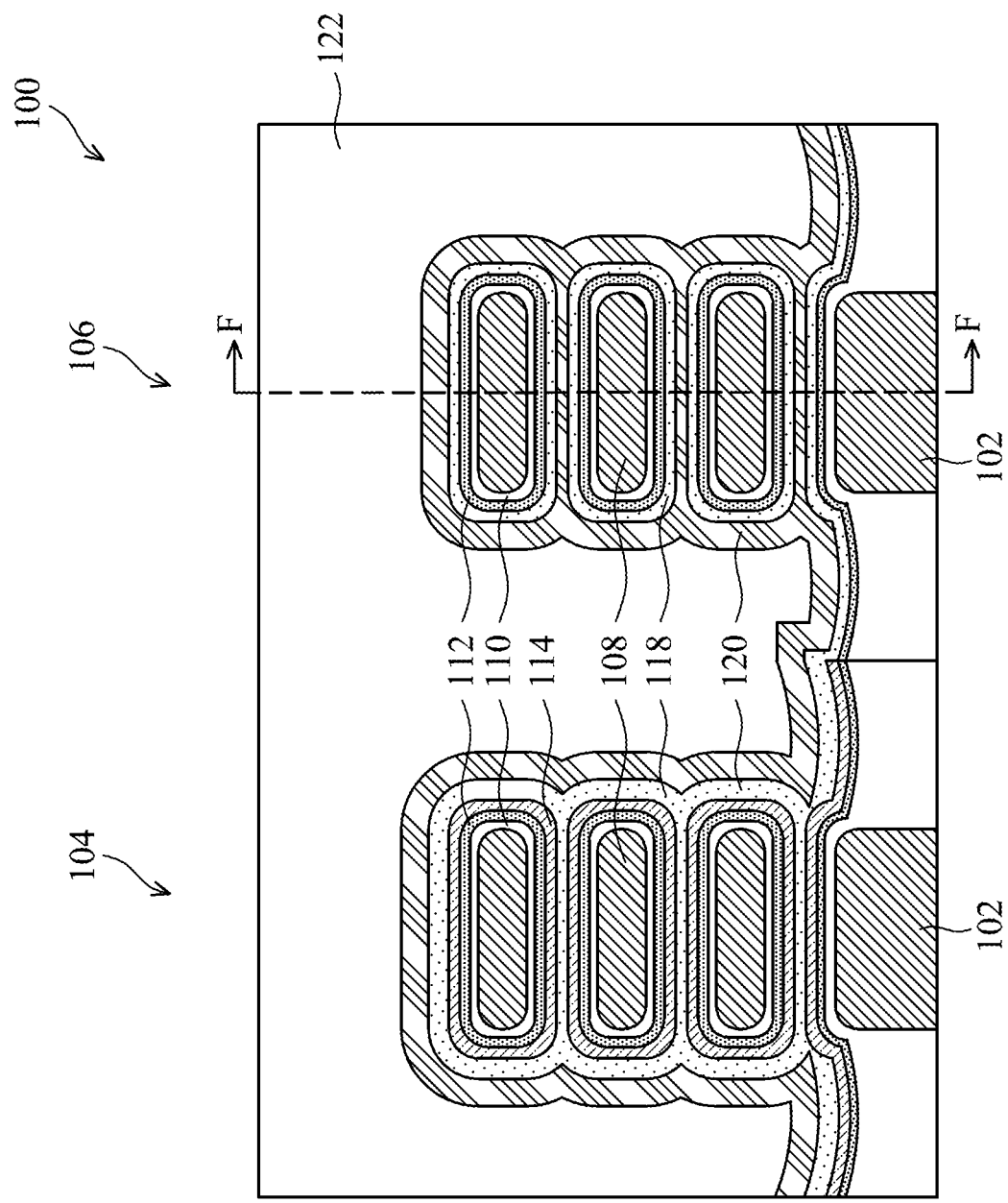

FIG. 1E is a cross-sectional view of the integrated circuit 100, according to one embodiment. In FIG. 1E, a third metal gate layer 122 has been deposited on the passivation layer 120 at both the N-type transistor 104 and the P-type transistor 106. The third metal gate layer 122 is a gate fill material. The gate fill material fills the remaining gaps around the nanosheets 108. The gate fill material also fills a trench by which contact is provided for the gates of the transistors 104 and 106, as illustrated more clearly in relation to FIG. 1F.

In the view of FIG. 1E, the third metal gate layer 122 is illustrated as a single gate metal. However, in practice, the third metal gate layer 122 may include multiple separate metal layers. The third metal gate layer 122 can include, W, Co, Mo, or other suitable materials. The initial metal gate layers and the gate fill material collectively make up the third metal gate layer 122. The third metal gate layer 122 can be deposited with one or more deposition processes including PVD, CVD, ALD, or other suitable deposition processes. Other materials, types of layers, and deposition processes can be utilized for the third metal gate layer 122 without departing from the scope of the present disclosure.

With respect to a cross-sectional view along the metal gate direction, the second metal gate layer 118 is merged between two adjacent nanosheets 108 in the N-type transistor 104. In the P-type transistor 106, the second metal gate layer 118 does not merge between adjacent nanosheets. This is due to the presence of the first metal gate layer 114 in the N-type transistor and the absence of the first gate metal layer 114 in the P-type transistor.

Figure 1F:
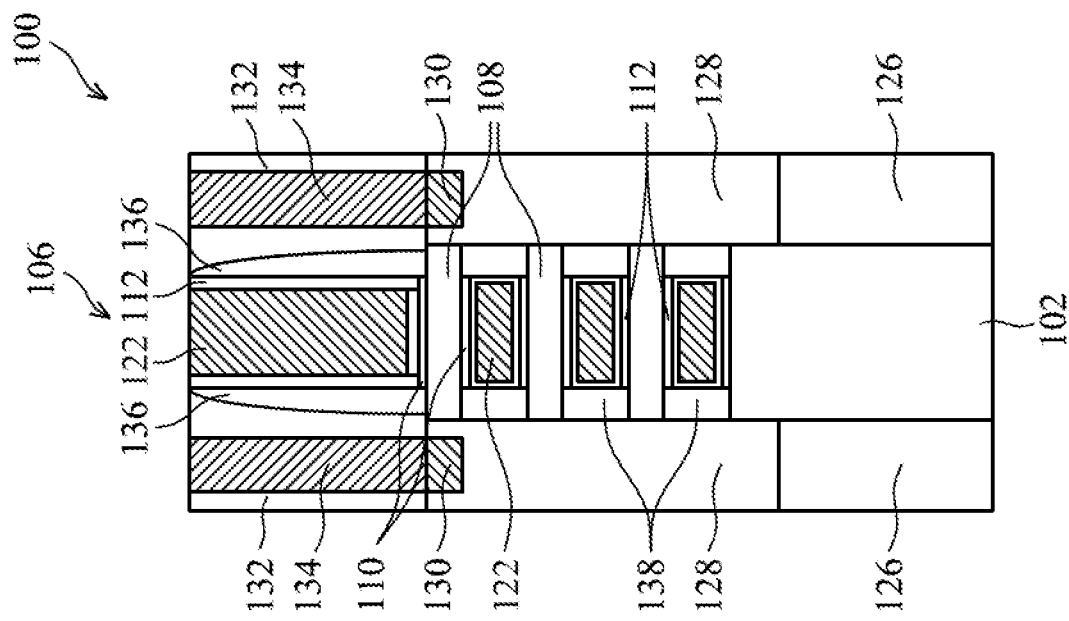

FIG. 1F is a cross-sectional view of the integrated circuit 100, according to one embodiment. The view of FIG. 1F is taken along cross-section lines F of FIG. 1E. The view of FIG. 1F illustrates more fully the overall structure of the transistor 106. The structure of the N-type transistor 104 will be substantially similar to the structure of the P-type transistor 106, aside from the differences already illustrated and differences in doping of semiconductor regions.

FIG. 1F illustrates shallow trench isolations 126 adjacent to the semiconductor substrate 102. The shallow trench isolation 126 can be utilized to separate groups of transistor structures formed in conjunction with the semiconductor substrate 102. The shallow trench isolation 126 can include a dielectric material. The dielectric material for the shallow trench isolation 126 may include silicon oxide, silicon nitride, silicon oxynitride (SiON), SiOCN, SiCN, fluorine-doped silicate glass (FSG), or a low-K dielectric material, formed by low pressure CVD (LPCVD), plasma-CVD or flowable CVD. Other materials and structures can be utilized for the shallow trench isolation 126 without departing from the scope of the present disclosure.

The integrated circuit 100 includes source and drain regions 128. The source and drain regions 128 includes semiconductor material. The source and drain regions 128 can be grown epitaxially from the semiconductor nanosheets 108. The source and drain regions 128 can be epitaxially grown from the semiconductor nanosheets 108 or from the substrate 102 prior to formation of the nanosheets 108. The source and drain regions 128 can be doped with N-type dopants species in the case of N-type transistors. The source and drain regions 128 can be doped with P-type dopant species in the case of P-type transistors.

The nanosheets 108 extend between the source and drain regions 128. As described previously, the nanosheets 108 correspond to the channel regions of the N-type transistor 104. By applying selected voltages to the third metal gate layer 122 and the source and drain regions 128, current flows through the nanosheets 108 between the source and drain regions 128.

FIG. 1F also illustrates dielectric spacers 138 positioned between the source and drain regions 128 and the third metal gate layer 122. More particularly, the spacers 138 are positioned between the high-K dielectric layer 112 and the source and drain regions 128. The spacers 138 can include one or more dielectric materials including silicon nitride, SiON, SiOCN, SiCN, silicon oxide, or other dielectric materials. Other dielectric materials can be utilized for the spacers 138 without departing from the scope of the present disclosure.

The view of FIG. 1F illustrates the interfacial dielectric layer 110 in contact with the semiconductor nanosheets 108. The high-K dielectric layer 112 is in contact with the interfacial dielectric layer 110. The third metal gate layer 122 is in contact with the high-K dielectric layer 112.

The integrated circuit 100 includes an interlayer dielectric layer 132 positioned on the source and drain regions 128. The interlayer dielectric layer 132 can include one or more of silicon oxide, silicon nitride, SICOH, SiOC, or an organic polymer. Other types of dielectric materials can be utilized for the interlayer dielectric layer 132 without departing from the scope of the present disclosure.

The integrated circuit 100 includes silicide regions 130 that have been formed in the source and drain regions 128. The silicide regions 130 can include titanium silicide, cobalt silicide, or other types of silicide. Contact plugs 134 have been formed in the interlayer dielectric layer 132. The contact plugs 134 can include cobalt or another suitable conductive material. The contact plugs 134 can be utilized to apply voltages to the source and drain regions 128 of the transistor 104. The contact plugs 134 can be surrounded by a titanium nitride glue layer.

The third metal gate layer 122 has been deposited in a trench formed in the interlevel dielectric layer 132. The third metal gate layer 122 also surrounds the nanosheets 108 as shown in FIG. 1E. Sidewall spacers 136 are positioned around the third metal gate layer 122 in the trench in the interlevel dielectric layer 132. The sidewall spacers 136 can include multiple dielectric layers including one or more of silicon nitride, silicon oxide, silicon carbide, or other suitable dielectric materials. The high-K dielectric layer 112 is also positioned on the sidewalls of the trench between the sidewall spacers 136 and the third metal gate layer 122. Other materials, structures, and features can be included in the gate all around N-type transistor 104, and correspondingly, the gate all around P-type transistor 106 without departing from the scope of the present disclosure.

Figure 2:
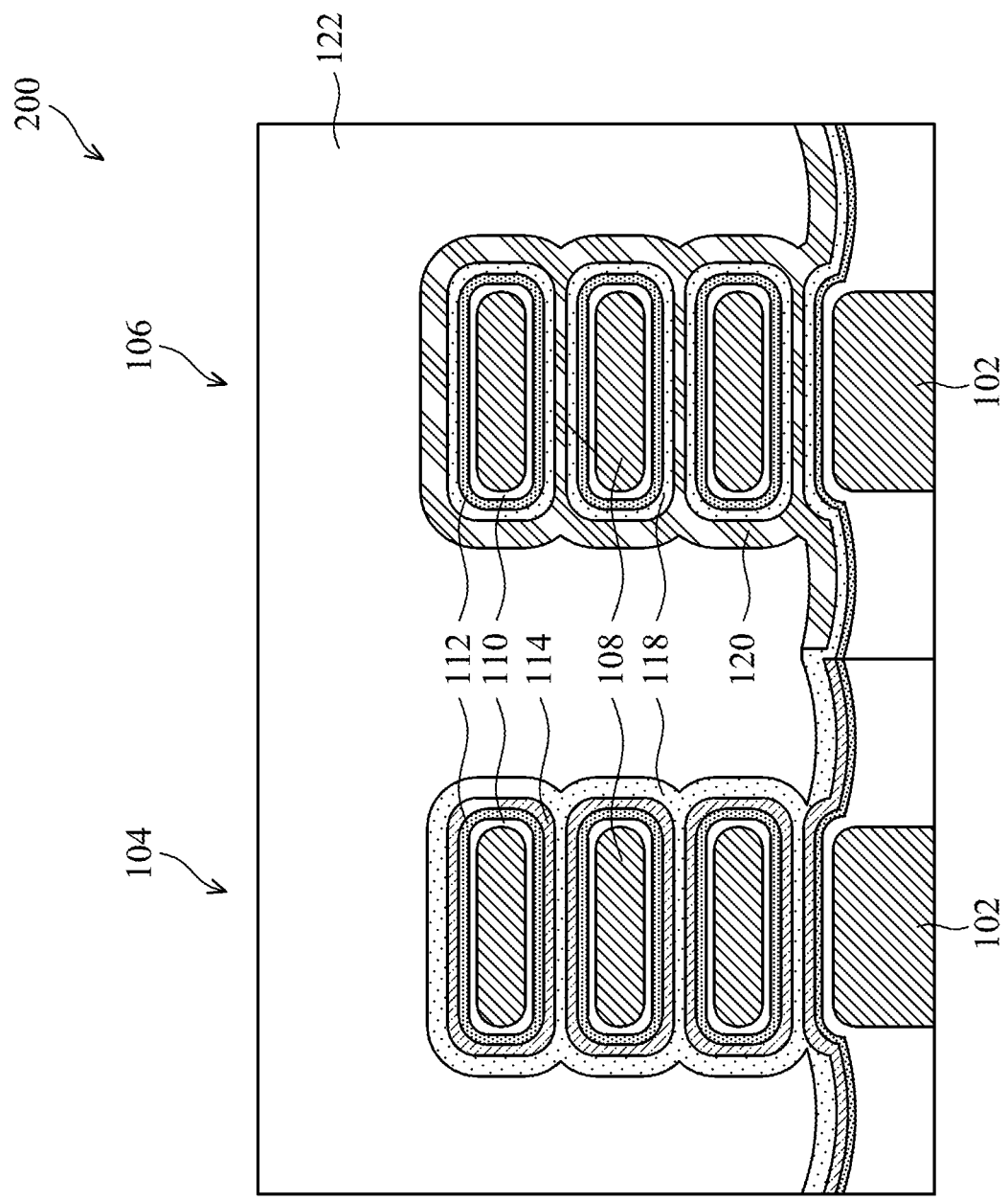
FIG. 2 is a cross-sectional view of an integrated circuit, according to one embodiment.

FIG. 2 is a cross-sectional view of an integrated circuit 200, according to one embodiment. The integrated circuit 200 includes an N-type transistor 104 and the P-type transistor 106. The integrated circuit 200 is substantially similar to the integrated circuit of FIG. 1E, except that the passivation layer 120 is not present on the N-type transistor 104. The passivation layer 120 is only found on the P-type transistor 106.

In one example, the process for forming the integrated circuit 200 is substantially the same as the process for form the integrated circuit 100 up to the view of FIG. 1D. For the integrated circuit 200, a mask can be formed on the P-type transistor 106, leaving the N-type transistor 104 exposed. An etching process can then be performed in the presence of the mask to remove the passivation layer 120 from the N-type transistor 104. The mask can then be removed from the P-type transistor 106. The third gate metal 122 can then be deposited as described in relation to FIG. 1E. The result is the structure shown in FIG. 2. Various other processes can be utilized to form the integrated circuit 200 of FIG. 2, without departing from the scope of the present disclosure. The passivation layer 120 helps ensure a high work function for the P-type transistor 106. This is based, in part, on the prevention of oxidation of the second gate metal layer 118, as described previously. Furthermore, the passivation layer 120 may itself increase the work function of the P-type transistor 106. The absence of the passivation layer 120 at the N-type transistor 104 may result in a reduction in the work-function of the N-type transistor 104.

Figure 3:
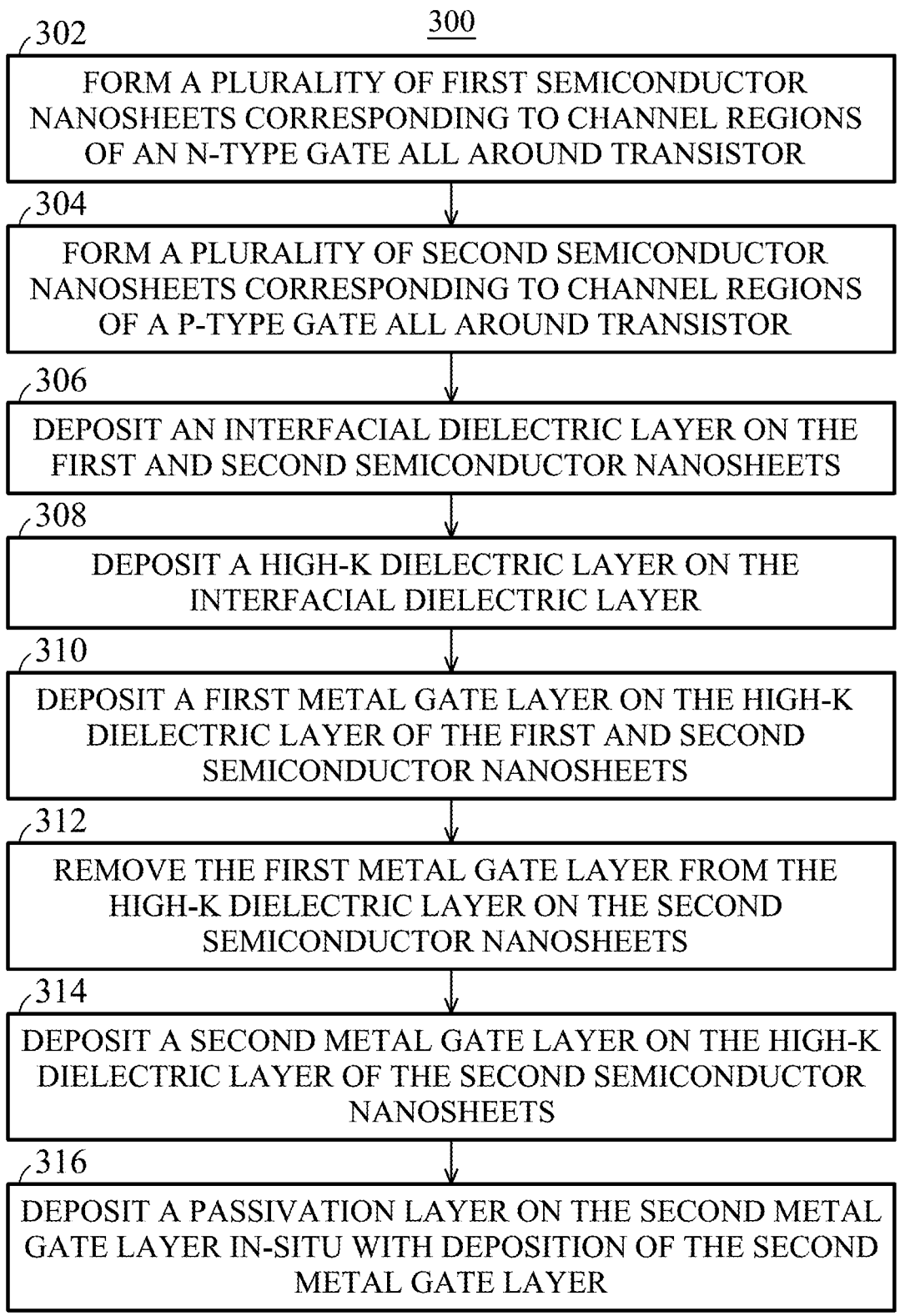
FIG. 3 is a flow diagram of a method for forming an integrated circuit, according to one embodiment.

FIG. 3 is a flow diagram of a method 300 for forming an integrated circuit, according to one embodiment. The method 300 can utilize structures, processes, and components disclosed in relation to FIGS. 1A-2. At 302, the method 300 includes forming a plurality of first semiconductor nanosheets corresponding to channel regions of an N-type gate all around transistor. One example of an N-type gate all around transistor is the gate all around transistor 104 of FIGS. 1A-1F. One example of first semiconductor nanosheets are the semiconductor nanosheets 108 of the transistor 104 of FIGS. 1A-1F. At 304, the method 300 includes forming a plurality of second semiconductor nanosheets corresponding to channel regions of a P-type gate all around transistor. One example of a P-type gate all around transistor is the gate all around transistor 106 of FIGS. 1A-1F. One example of second semiconductor nanosheets are the semiconductor nanosheets 108 of the transistor 106 of FIGS. 1A-1F. At 306, the method 300 includes depositing an interfacial dielectric layer on the first and second semiconductor nanosheets. One example of an interfacial dielectric layer is the interfacial dielectric layer 110 of FIG. 1A. At 308, the method 300 includes depositing a high-K dielectric layer on the interfacial dielectric layer. One example of a high-K dielectric layer is the high-K dielectric layer 112 of FIG. 1A. At 310, the method 300 includes a first metal gate layer on the high-K dielectric layer of first and second semiconductor nanosheets. One example of a first metal gate layer is the first metal gate layer 114 of FIG. 1B. At 312, the method 300 includes removing the first metal gate layer from the high-K dielectric layer on the second semiconductor nanosheets. At 314, the method 300 includes depositing a second metal gate layer on the high-K dielectric layer of the second semiconductor nanosheets. One example of a second gate metal layer is the second gate metal layer 118 of FIG. 1D. At 316, the method 300 includes depositing a passivation layer on the second metal gate layer in-situ with deposition of the second metal gate layer. One example of a passivation layer is the passivation layer 120 of FIG. 1E.

Figure 4:
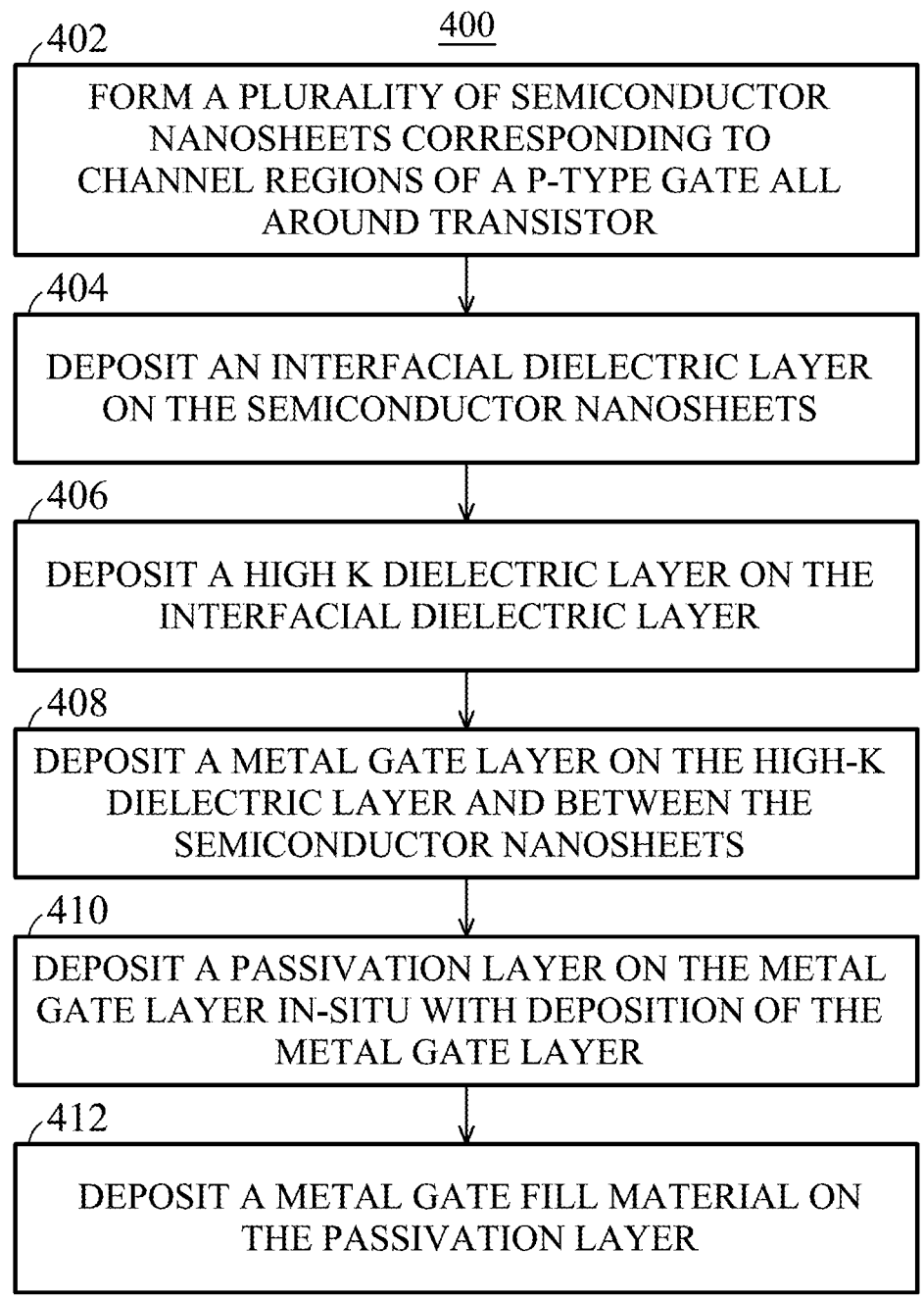
FIG. 4 is a flow diagram of a method for forming an integrated circuit, according to one embodiment.

FIG. 4 is a flow diagram of a method 400 for forming an integrated circuit, according to one embodiment. The method 400 can utilize structures, processes, and components disclosed in relation to FIGS. 1A-2. At 402, the method 400 includes forming a plurality of semiconductor nanosheets corresponding to channel regions of a P-type gate all around transistor. One example of a P-type gate all around transistor is the transistor 106 of FIGS. 1A-1F. One example of semiconductor nanosheets is the semiconductor nanosheets 108 of FIG. 1A. At 404, the method 400 includes depositing an interfacial dielectric layer on the semiconductor nanosheets. One example of an interfacial dielectric layer is the interfacial dielectric layer 110 of FIG. 1A. At 406, the method 400 includes depositing a high-K dielectric layer on the interfacial dielectric layer. One example of a high-K dielectric layer is the high-K dielectric layer 112 of FIG. 1A. At 408, method 400 includes depositing metal gate layer on the high-K dielectric layer and between the semiconductor nanosheets. One example of a metal gate layer is the metal gate layer 118 of FIG. 1D. At 410, the method 400 includes depositing a passivation layer on the metal gate layer in-situ with deposition of the metal gate layer. One example of a passivation layer is the passivation layer 120 of FIG. 1D. At 412, the method 400 includes depositing a metal gate fill material on the passivation layer. One example of a metal gate fill material is the metal gate layer 122 of FIG. 1E.

In one embodiment, a method includes forming a plurality of semiconductor nanosheets corresponding to channel regions of a P-type gate all around transistor, depositing an interfacial dielectric layer on the semiconductor nanosheets, and depositing a high-K dielectric layer on the interfacial dielectric layer. The method includes depositing a metal gate layer on the high-K dielectric layer and between the semiconductor nanosheets, depositing a passivation layer on the metal gate layer in-situ with deposition of the metal gate layer, and depositing a metal gate fill material on the passivation layer.

In one embodiment, a method includes forming a plurality of first semiconductor nanosheets corresponding to channel regions of an N-type gate all around transistor, forming a plurality of second semiconductor nanosheets corresponding to channel regions of a P-type gate all around transistor, and depositing an interfacial dielectric layer on the first and second semiconductor nanosheets. The method includes depositing a high-K dielectric layer on the interfacial dielectric layer, depositing a first metal gate layer on the high-K dielectric layer of first and second semiconductor nanosheets, and removing the first metal gate layer from the high-K dielectric layer on the second semiconductor nanosheets. The method includes depositing a second metal gate layer on the high-K dielectric layer of the second semiconductor nanosheets and depositing a passivation layer on the second metal gate layer in-situ with deposition of the second metal gate layer.

In one embodiment, an integrated circuit includes an N-type gate all around transistor. The N-type gate all around transistor includes a plurality of first semiconductor nanosheets corresponding to channel regions of the first gate all around transistor, an interfacial dielectric layer positioned on the first semiconductor nanosheets, a high-K dielectric layer positioned on the interfacial dielectric layer, a first metal gate layer positioned directly on the high-K dielectric layer, and a second metal gate layer positioned on the first metal gate layer. The integrated circuit includes a P-type gate all around transistor. The P-type gate all around transistor includes a plurality of second semiconductor nanosheets corresponding to channel regions of the P-type gate all around transistor, the interfacial dielectric layer positioned on the second semiconductor nanosheets, the high-K dielectric layer positioned on the interfacial dielectric layer, the second metal gate layer positioned directly on the high-K dielectric layer, and an in-situ passivation layer positioned on the second metal gate layer.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a plurality of first semiconductor nanosheets corresponding to channel regions of a first gate all around transistor;
   forming a plurality of second semiconductor nanosheets corresponding to channel regions of a second gate all around transistor;
   forming a first trench in an interlevel dielectric layer above the semiconductor nanosheets;
   depositing, in a first deposition process, a first interfacial dielectric layer on the first semiconductor nanosheets and a second interfacial dielectric layer on the second semiconductor nanosheets;
   depositing, in a second deposition process, a first high-K dielectric layer on the first interfacial dielectric layer and a second high-K dielectric layer on the second interfacial dielectric layer;
   depositing, in a third deposition process, a first layer of a first gate metal in direct contact with the first high-K dielectric layer and between the first semiconductor nanosheets and a second layer of the first gate metal in direct contact with the second high-K dielectric layer and between the second semiconductor nanosheets;

exposing the second high-K dielectric layer by removing the second layer of the first gate metal;
depositing, in a fourth deposition process, a first layer of a second gate metal in direct contact with the first layer of the first gate metal and a second layer of the second gate metal in direct contact with the second high-K dielectric layer;
depositing, in a fifth deposition process in-situ with the fourth deposition process, a first passivation layer in direct contact with the first layer of the second gate metal and a second passivation layer in direct contact with the second layer of the second gate metal; and
depositing, in a sixth deposition process, a metal gate fill material in direct contact with the first passivation layer and filling the first trench above the first semiconductor nanosheets.

2. The method of claim 1, further comprising performing the fifth deposition process without breaking vacuum from the fourth deposition process.

3. The method of claim 2, further comprising performing the fourth deposition process with a first atomic layer deposition process.

4. The method of claim 3, further comprising performing the fifth deposition process with a second atomic layer deposition process without breaking the vacuum from the first atomic layer deposition process.

5. The method of claim 2, further comprising:
performing the fourth deposition process in a first deposition chamber; and
performing the fifth deposition process in a second deposition chamber in fluid communication with the first deposition chamber.

6. The method of claim 1, wherein the second passivation layer is positioned between the second semiconductor nanosheets.

7. The method of claim 1, wherein a work function of the second gate all around transistor is greater than or equal to 4.9 eV.

8. A method, comprising:
forming a plurality of first semiconductor nanosheets corresponding to channel regions of an N-type gate all around transistor;
forming a plurality of second semiconductor nanosheets corresponding to channel regions of a P-type gate all around transistor;
forming a first trench in an interlevel dielectric layer above the first semiconductor nanosheets;
forming a second trench in the interlevel dielectric layer above the second semiconductor nanosheets;
depositing, with a first deposition process, a first interfacial dielectric layer on the first and a second interfacial dielectric layer on the second semiconductor nanosheets;
depositing, with a second deposition process, a first high-K dielectric layer on the first interfacial dielectric layer and a second high-K dielectric layer on the second interfacial dielectric layer;
depositing, with a third deposition process, a first layer of a first gate metal in direct contact with the first high-K dielectric layer and a second layer of the first gate metal in direct contact with the second high-K dielectric layer;
exposing the second high-K dielectric layer by removing the second layer of the first gate metal from the second high-K dielectric layer;
depositing, with a fourth deposition process, a first layer of a second gate metal in direct contact with the first layer of the first gate metal and a second layer of the second gate metal in direct contact with the second high-K dielectric layer;
depositing, with a fifth deposition process in-situ with the fourth deposition process, a first passivation layer in direct contact with the first layer of the second gate metal and a second passivation layer in direct contact with the second layer of the second gate metal; and
depositing, with a sixth deposition process, a first layer of a metal gate fill material in direct contact with the first passivation layer and filling the first trench, and a second layer of the metal gate fill material in contact with the second passivation layer and filling the second trench.

9. The method of claim 8, further comprising:
covering the first layer of the first gate metal in photoresist at the N-type gate all around transistor;
removing the second layer of the first gate metal from the second high-K dielectric layer on the second semiconductor nanosheets while the first layer of the first gate metal is covered by the photoresist at the N-type gate all around transistor; and
removing the photoresist from the first layer of the first gate metal at the N-type gate all around transistor after removing the second layer of the first gate metal from the second high-K dielectric layer on the second semiconductor nanosheets.

10. The method of claim 9, further comprising the fourth deposition process after removing the photoresist from the second layer of the first gate metal.

11. The method of claim 8, wherein the second layer of the metal gate fill material and the second layer of the second gate metal correspond to a metal gate of the P-type gate all around transistor.

12. A method, comprising:
forming, in a first deposition process, a first gate dielectric layer on first channels of an N-type gate all around transistor and a second gate dielectric on second channels of a P-type gate all around transistor;
forming a first trench in an interlevel dielectric layer above the first channels;
forming a second trench in the interlevel dielectric layer above the second channels;
forming, in a second deposition process, a first layer of a first gate metal in direct contact with the first gate dielectric layer and a second layer of the first gate metal in direct contact with the second gate dielectric layer;
exposing the second gate dielectric layer by removing the second layer of the first gate metal;
forming, in a third deposition process, a first layer of a second gate metal in direct contact with the first layer of the first gate metal and a second layer of the second gate metal in direct contact the second gate dielectric layer;
forming, in a fourth deposition process in situ with the third deposition process, a first passivation layer in direct contact with the first layer of the second gate metal and a second passivation layer positioned directly on the second layer second gate metal; and
depositing, in a fifth deposition process, a first layer of a metal gate fill material in direct contact with the first passivation layer and a second layer of the metal gate fill material in contact with the second passivation layer.

13. The method of claim 12, wherein the second layer of the second gate metal is positioned between the second channel regions.

14. The method of claim 13, wherein the first gate metal includes carbon and one or more of titanium and tantalum.

15. The method of claim 14, wherein the second gate metal includes nitrogen and one or more of titanium, tantalum, tungsten and molybdenum.

16. The method of claim 15, wherein the first and second passivation layers include a different material than the second gate metal.

17. The method of claim 12, wherein the second passivation layer is positioned between the second channel regions, wherein the first passivation layer is not positioned between the first channel regions.

18. The method of claim 1, wherein the first and second passivation layers are a metal nitride.

19. The method of claim 18, wherein the metal gate fill material is tungsten.

20. The method of claim 1, wherein the first gate all around transistor is an N-type transistor and the second gate all around transistor is a P-type transistor.

* * * * *